(12) United States Patent
Lin et al.

(10) Patent No.: US 7,570,099 B2
(45) Date of Patent: Aug. 4, 2009

(54) CONVERSION MIXER WITH HIGH IMPEDANCE CIRCUIT

(75) Inventors: Chen-Ching Lin, Hsin-Tien (TW); Ying-Che Tseng, Hsin-Tien (TW)

(73) Assignee: Via Technologies, Inc., Taipei (TW)

( * ) Notice: Subject to any disclaimer, the term of this patent is extended or adjusted under 35 U.S.C. 154(b) by 156 days.

(21) Appl. No.: 11/723,699

(22) Filed: Mar. 21, 2007

(65) Prior Publication Data
US 2007/0264960 A1    Nov. 15, 2007

Related U.S. Application Data

(60) Provisional application No. 60/799,325, filed on May 11, 2006.

(51) Int. Cl.
*G06G 7/44*    (2006.01)
(52) U.S. Cl. ..................... 327/356; 327/359
(58) Field of Classification Search ................. 327/356, 327/359
See application file for complete search history.

(56) References Cited

U.S. PATENT DOCUMENTS 6,429,721 B1 *  8/2002  Armitage et al. ............ 327/359
7,071,760 B2 *  7/2006  Yoshida ...................... 327/359

* cited by examiner

*Primary Examiner*—Kenneth B. Wells
(74) *Attorney, Agent, or Firm*—Birch, Stewart, Kolasch & Birch, LLP

(57) ABSTRACT

A conversion mixer includes a mixing circuit, a duplicating circuit and a loading circuit. The mixing circuit receives a couple of first input signals and a couple of second input signals and mixes the couple of first input signals with the couple of second input signals to output a couple of mixed signals. The duplicating circuit coupled to the mixing circuit receives the couple of mixed signals and duplicates the couple of mixed signals to output a couple of duplicated signals. The loading circuit coupled to the duplicating circuit receives the couple of duplicated signals and outputs a couple of output signals according to the couple of duplicated signals.

12 Claims, 4 Drawing Sheets

CONVERSION MIXER WITH HIGH IMPEDANCE CIRCUIT

This Nonprovisional application claims priority under 35 U.S.C. §119(e) on U.S. Provisional Application Nos. 60/799,325 filed on May 11, 2006, the entire contents of which are hereby incorporated by reference.

BACKGROUND OF THE INVENTION

1. Field of Invention

The invention relates to a conversion mixer, and, in particular, to a conversion mixer for converting a high-frequency input signal into a low-frequency output signal.

2. Related Art

In microwave communication technology, because radio frequency (RF) signals in a transceiver cannot be easily processed, the received radio frequency signal is modulated and down-sampled to a baseband signal to facilitate the subsequent signal processing procedures.

Currently, a conversion mixer for mixing and modulating the radio frequency signal with a local oscillation signal and thus generating a new middle signal is often added to an RF front-end circuit of the transceiver. In addition, the conversion mixer also controls important parameters, such as noise figure isolation, 1 dB compression point and third-order alternating modulation point (IP3) of a transceiver circuit. So, the conversion mixer plays an important role in the transceiver. Currently, the conversion mixer is widely used in the radio frequency circuit in a chip of a mobile phone.

With regard to the conventional conversion mixers, active conversion mixers are the most common conversion mixers, and double balanced mixers, also referred to as Gilbert-cell mixers, are the most common of the active conversion mixers.

Referring to FIG. 1, a Gilbert-cell mixer 1 includes a BJT differential pair circuit 11, a current switching circuit 12 and a loading circuit 13. The BJT differential pair circuit 11 and the current switching circuit 12 are respectively composed of transistors Q5 and Q6, and transistors Q1 to Q4. The BJT differential pair circuit 11 receives a couple of externally inputted high-frequency radio frequency signals RF+ and RF−, and the current switching circuit 12 has two inversely switching sub-current switching circuits 121 for respectively receiving a couple of local oscillation signals LO+ and LO−.

Herein, the Gilbert-cell mixer 1 operates as follows. The couple of radio frequency signals RF+ and RF− is received by the BJT differential pair circuit 11, and a couple of radio frequency current signals I.sub.R+ and I.sub.R− is generated and outputted. The current switching circuit 12 receives the couple of radio frequency current signals I.sub.R+ and I.sub.R− and the couple of local oscillation signals LO+ and LO−, and mixes the couple of radio frequency current signals I.sub.R+and I.sub.R− with the couple of local oscillation signals LO+ and LO− using the inversely switching sub-current switching circuits 121 in the current switching circuit 12. Then, a cross-coupling procedure is performed so that a couple of baseband current signals IF+ and IF− is outputted from the loading circuit 13.

Because a larger current has to be provided to drive the Gilbert-cell mixer 1, when the provided current I flows through the loading circuit 13, the voltage V' (V'=VDD−V) provided by a supply power VDD to the BJT differential pair circuit 11 and the current switching circuit 12 is equal to the supply power VDD minus the voltage V (V=I×RL) of the loading circuit 13. If the residual voltage V' of the supply power VDD is too low, the operation regions of the transistors of the BJT differential pair circuit 11 and the current switching circuit 12 may be influenced so that the couple of baseband current signals IF+ and IF− is influenced by the loading circuit 13 more greatly than by the couple of radio frequency signals RF+ and RF−, thereby causing a dead zone phenomenon.

In addition, the couple of baseband current signals IF+ and IF− is restricted by the size of the range of the voltage value of the loading circuit 13 so that the operation range of the couple of baseband current signals IF+ and IF− is small, and the couple of baseband current signals IF+ and IF− have non-linear outputs. Also, because the Gilbert-cell mixer 1 needs to utilize the higher supply current I, its power consumption becomes a serious problem.

Thus, it is an important subject to provide a conversion mixer capable of reducing the power consumption and having linear output signals with a larger operational range.

SUMMARY OF THE INVENTION

In view of the foregoing, the invention is to provide a conversion mixer capable of reducing the power consumption and having linear output signals of larger operational range.

To achieve the above, the invention discloses a conversion mixer including a mixing circuit, a duplicating circuit and a loading circuit. The mixing circuit receives a couple of first input signals and a couple of second input signals and mixes the couple of first input signals with the couple of second input signals to output a couple of mixed signals. The duplicating circuit coupled to the mixing circuit receives the couple of mixed signals and duplicates the couple of mixed signals to output a couple of duplicated signals. The loading circuit coupled to the duplicating circuit receives the couple of duplicated signals and outputs a couple of output signals according to the couple of duplicated signals.

In addition, the invention also discloses a conversion mixer including a mixing circuit, a duplicating circuit, a high impedance circuit and a loading circuit. The mixing circuit receives a couple of first input signals and a couple of second input signals, and mixes the couple of first input signals with the couple of second input signals to output a couple of mixed signals. The duplicating circuit, which is coupled to the mixing circuit, receives the couple of mixed signals and duplicates the couple of mixed signals to output a couple of duplicated signals. The high impedance circuit, which is coupled to the mixing circuit and the duplicating circuit, guides the couple of mixed signals to be inputted to the duplicating circuit. The loading circuit, which is coupled to the duplicating circuit, receives the couple of duplicated signals and outputs a couple of output signals according to the couple of duplicated signals.

As mentioned above, the conversion mixer of the invention utilizes the mixing circuit to mix the couple of first high-frequency input signals with the couple of second high-frequency input signals and then output the couple of low-frequency mixed signals. Also, the duplicating circuit duplicates the couple of mixed signals into the couple of duplicated signals, and then the loading circuit outputs the couple of output signals. Compared with the prior art, the duplicating circuit can separate the mixing circuit from the loading circuit so that the influence of the loading circuit on the couple of output signals is reduced, and the couple of output signals is changed with the influence of the couple of first input signals. Alternatively, using the high impedance circuit can shunt the DC and AC components of the couple of mixed signals so that the DC component of the large signal in the couple of mixed signals passes through the high impedance circuit, and only the AC component of the small signal in the couple of mixed signals is sent to the duplicating circuit. According to this manner, the couple of output signals is only influenced by the couple of first input signals, and the output signal is small, such that the couple of output signals is linear and has the above mentioned larger operation range while avoiding the dead zone phenomenon. In addition, the current value of the duplicated signal can be reduced by adjusting the ratio of the channel regions of the transistors in the current mirror of the duplicating circuit so that power consumption can be reduced.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
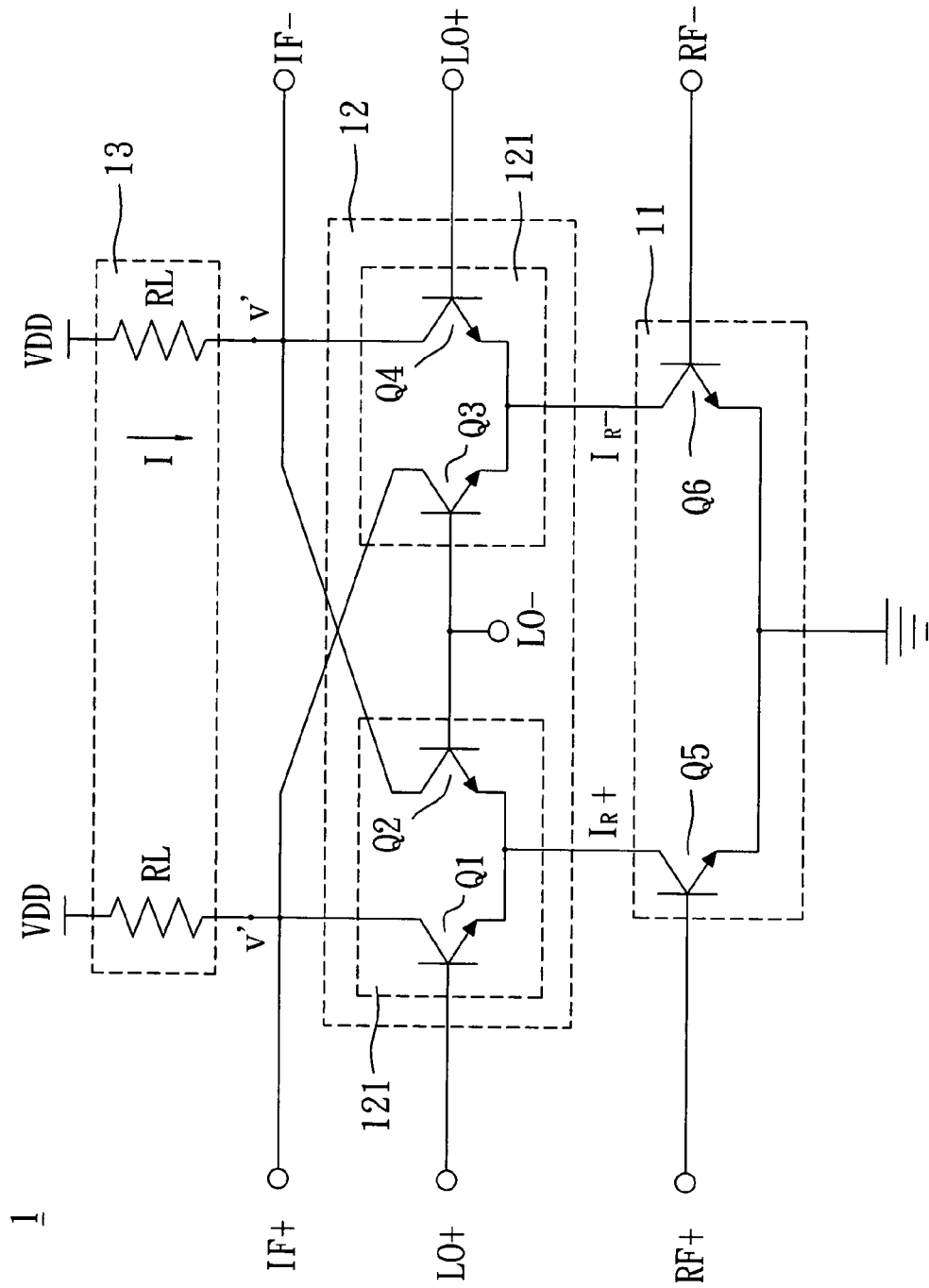
FIG. 1 is a schematic illustration showing a conventional Gilbert-cell mixer.
Figure 2:
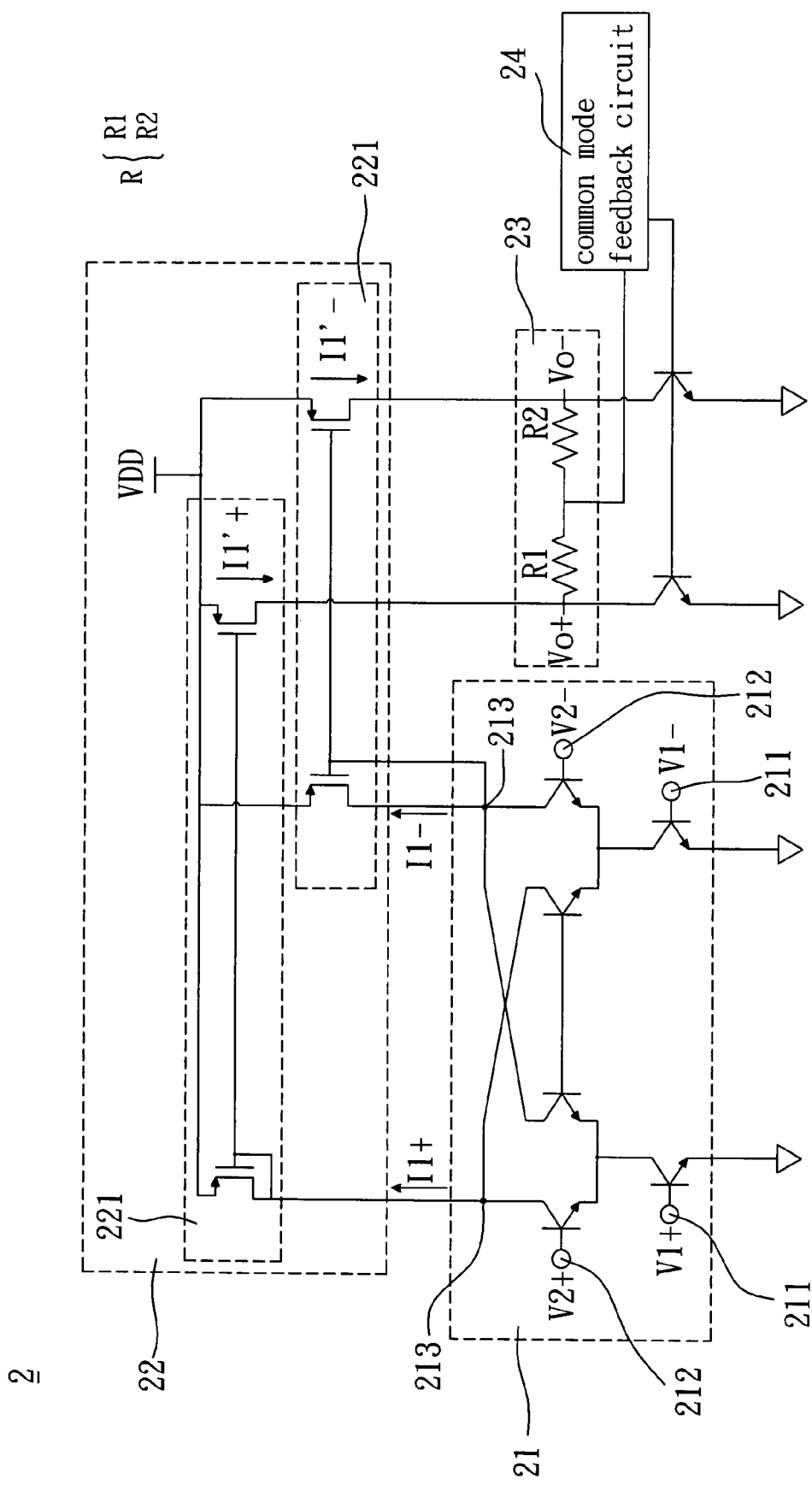
FIG. 2 shows a conversion mixer according to a first embodiment of the invention.

Referring to FIG. 2, a conversion mixer 2 according to a first embodiment of the invention includes a mixing circuit 21, a duplicating circuit 22 and a loading circuit 23. The conversion mixer 2 of this embodiment may be a direct down-sampling conversion mixer.

The mixing circuit 21 of this embodiment includes a first differential input terminal 211, a second differential input terminal 212 and a differential output terminal 213. The first differential input terminal 211 and the second differential input terminal 212 respectively receive a couple of first input signals V1+ and V1− and a couple of second input signals V2+ and V2−. The mixing circuit 21 mixes the couple of first input signals V1+ and V1− with the couple of second input signals V2+ and V2− and thus outputs a couple of mixed signals I1+ and I1− from the differential output terminal 213. The couple of first input signals V1+ and V1− and the couple of second input signals V2+ and V2− are high-frequency signals, and the couple of mixed signals I1+ and I1− is a couple of low-frequency signals.

In addition, the duplicating circuit 22 coupled to the mixing circuit 21 and a voltage source VDD includes two current mirrors 221. The two current mirrors 221 are coupled to the differential output terminal 213, receive the couple of mixed signals I1+ and I1−, and duplicate the couple of mixed signals I1+ and I1− to output a couple of duplicated signals I1'+ and I1'−. The couple of mixed signals I1+ and I1− and the couple of duplicated signals I1'+ and I1'− are differential currents. In addition, the voltage source VDD drives the mixing circuit 21 and the loading circuit 23 through the duplicating circuit 22.

Furthermore, the loading circuit 23 includes a resistor R, which may be divided into a first resistor R1 and a second resistor R2. First terminals of the first resistor R1 and the second resistor R2 are coupled to each of the current mirrors 221 to receive the couple of duplicated signals I1'+ and I1'−, and to output a couple of output signals Vo+ and Vo− at the terminals of the first resistor R1 and the second resistor R2 coupled to each of the current mirrors 221 according to the couple of duplicated signals I1'+ and I1'−. In addition, second terminals of the first resistor R1 and the second resistor R2 are coupled to each other. The couple of output signals Vo+ and Vo− may be a couple of voltages.

In addition, referring again to FIG. 2, the conversion mixer 2 of this embodiment further includes a common mode feedback circuit 24, which is coupled to the second terminals of the first resistor R1 and the second resistor R2 of the loading circuit 23 to stabilize the couple of output signals Vo+ and Vo− outputted from the loading circuit 23.

As shown in FIG. 2, the conversion mixer 2 of this embodiment operates as follows. The first differential input terminal 211 of the mixing circuit 21 receives the couple of high-frequency first input signals V1+ and V1− from the outside, and receives the couple of second high-frequency input signals V2+ and V2− at the second differential input terminal 212. The mixing circuit 21 cross-couples the couple of first input signals V1+ and V1− to the couple of second input signals V2+ and V2−, and then the couple of low-frequency mixed signals I1+ and I1− is outputted from the differential output terminal 213. Next, the duplicating circuit 22 receives the couple of mixed signals I1+ and I1−, and the two current mirrors 221 duplicate the couple of mixed signals I1+ and I1− to output the couple of duplicated signals I1'+ and I1'−. The resistors R (the first resistor R1 and the second resistor R2) of the loading circuit 23 receive the couple of duplicated signals I1'+ and I1'−. Then, the common mode feedback circuit 24 enables the loading circuit 23 to stabilize and output the couple of output signals Vo+ and Vo− at the terminals of the resistors R (the first resistor R1 and the second resistor R2) coupled to each of the current mirrors 221 according to the couple of duplicated signals I1'+ and I1'−.

In the conversion mixer 2 of this embodiment, the two current mirrors 221 of the duplicating circuit 22, respectively coupled to the loading circuit 23 and the mixing circuit 21, are utilized, but the loading circuit 23 is also separated from the mixing circuit 21. Thus, the influence of the loading circuit 23 on the mixing circuit 21 is reduced such that the couple of output signals Vo+ and Vo− is more greatly influenced by the couple of first input signals V1+ and V1−. Thus, the linearity and the larger operational range can be achieved so as to avoid the dead zone phenomenon.

Figure 3:
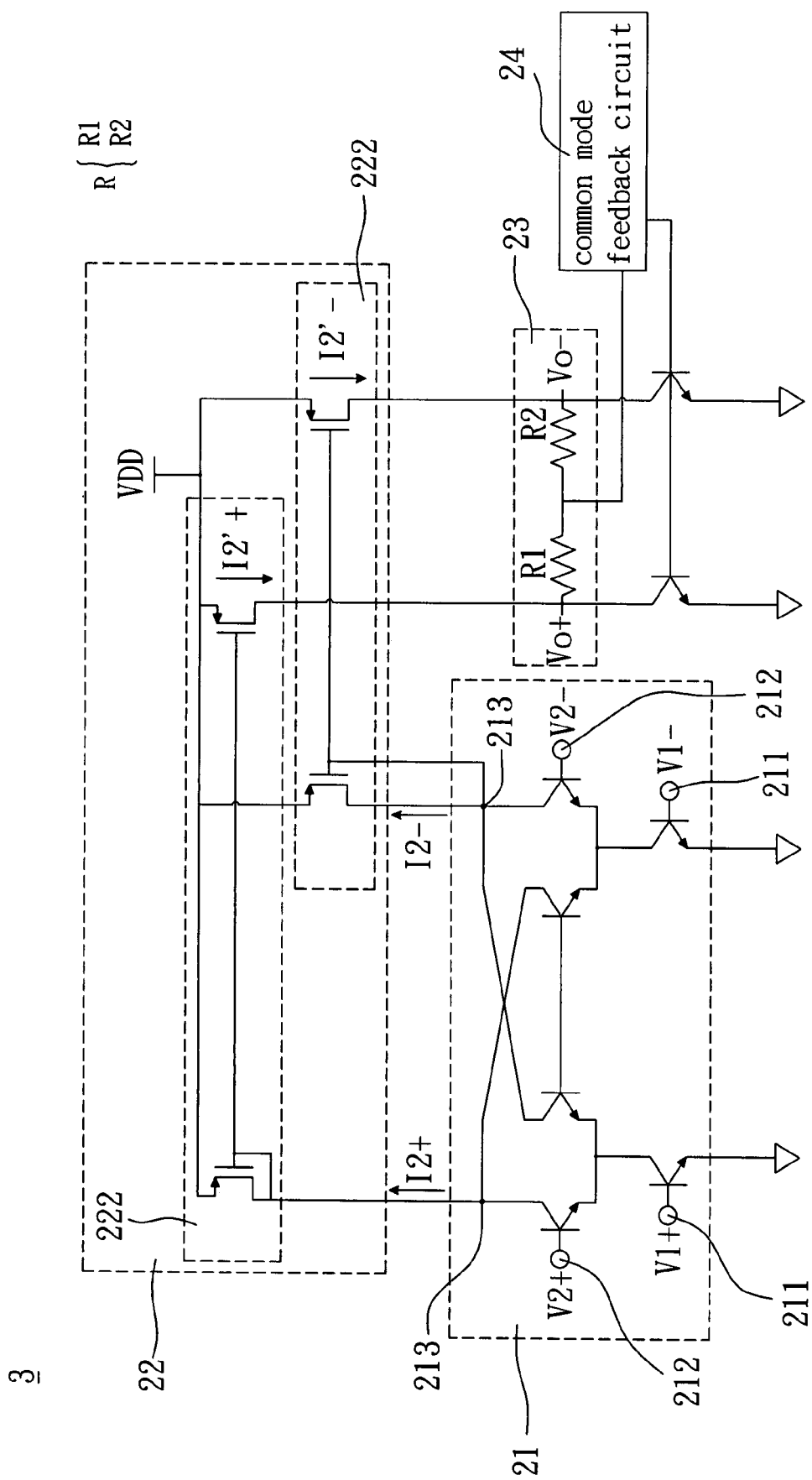
FIG. 3 shows a conversion mixer according to a second embodiment of the invention.

In addition, referring to FIG. 3, a conversion mixer 3 according to a second embodiment of the invention includes a mixing circuit 21, a duplicating circuit 22 and a loading circuit 23. The mixing circuit 21 receives a couple of first input signals V1+ and V1− and a couple of second input signals V2+ and V2−, and mixes the couple of first input signals V1+ and V1− with the couple of second input signals V2+ and V2− to output a couple of mixed signals I2+ and I2−. The duplicating circuit 22 coupled to the mixing circuit 21 receives the couple of mixed signals I2+ and I2−, and duplicates the couple of mixed signals I2+ and I2− to output a couple of duplicated signals I2'+ and I2'−. The loading circuit 23 coupled to the duplicating circuit 22 receives the couple of duplicated signals I2'+ and I2'−, and outputs a couple of output signals Vo+ and Vo− according to the couple of duplicated signals I2'+ and I2'−.

The conversion mixer 3 of this embodiment further includes a common mode feedback circuit 24, which is coupled to the loading circuit 23 and stabilizes the couple of output signals Vo+ and Vo− outputted from the loading circuit 23.

The structures and the functions of the mixing circuit 21, the duplicating circuit 22, the loading circuit 23 and the common mode feedback circuit 24 of this embodiment are the same as those of the mixing circuit 21, the duplicating circuit 22, the loading circuit 23 and the common mode feedback circuit 24 of the first embodiment of FIG. 2, so detailed descriptions thereof will be omitted.

The difference between the second embodiment and the first embodiment is that two current mirrors 222 in the duplicating circuit 22 enable the current values of the couple of mixed signals I2+ and I2− to differ from those of the couple of duplicated signals I2'+ and I2'−. The current value of the transistor can be determined according to the aspect ratio (W/L) in the channel region of the transistor. So, the aspect ratio of the transistor Q7 in the current mirror 222 may be designed to be M times that of the transistor Q9 in order to reduce the current value of the duplicating circuit 22 of this embodiment. Similarly, the aspect ratio of the transistor Q8 in the current mirror 222 is designed to be M times that of the transistor Q10 so that the value of the current I2+ flowing through the transistor Q7 or the value of the current I2− flowing through the transistor Q8 is duplicated to be M times that of the current I2'+ flowing through the transistor Q9 or M times that of the current I2'− flowing through the transistor Q10. That is, the current (I2'+)=(I2+)/M or the current (I2')−=(I2−)/M. When the duplicating circuit 22 duplicates the couple of mixed signals I2+ and I2− and the mixed signals I2+ and I2− are duplicated into the couple of duplicated signals I2'+ and I2'− of the transistors Q9 and Q10 through the transistors Q7 and Q8, the current values of the couple of mixed signals I2+ and I2− become M times that of the couple of duplicated signals I2'+ and I2'−.

This embodiment adopts the duplicating circuit 22 to be coupled to the mixing circuit 21 and the loading circuit 23 so that the mixing circuit 21 is separated from the loading circuit 23 and the loading circuit 23 has a smaller influence on the couple of output signals Vo+ and Vo− in order to prevent the dead zone phenomenon. Thus, the range of the couple of output signals Vo+ and Vo− is changed with the change of the range of the couple of first input signals V1+ and V1−, and the couple of output signals Vo+ and Vo− is linear and the operation range larger. In addition, the ratios of the transistors Q7 to Q9 or the ratios of the transistors Q8 to Q10 in the two current mirrors 222 are different from each other, the current values of the couple of mixed signals I2+ and I2− and the couple of duplicated signals I2'+ and I2'− are different from each other. So, the levels of the couple of duplicated signals I2'+ and I2'− are decreased, thereby reducing the power consumption of the conversion mixer 3 of this embodiment.

Figure 4:
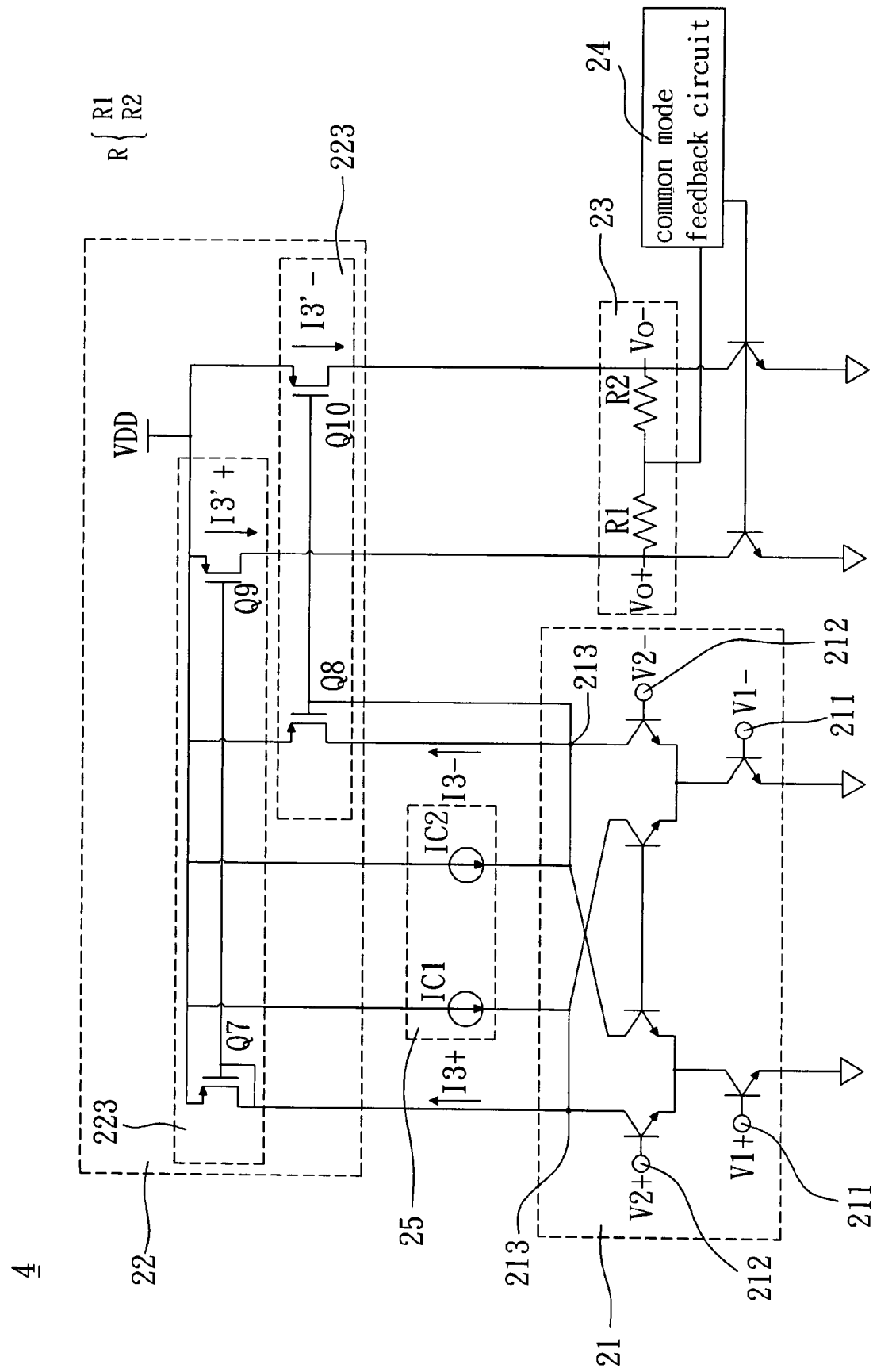
FIG. 4 shows a conversion mixer according to a third embodiment of the invention.

Referring to FIG. 4, a conversion mixer 4 according to a third embodiment of the invention includes a mixing circuit 21, a duplicating circuit 22, a high impedance circuit 25, a loading circuit 23 and a common mode feedback circuit 24.

The mixing circuit 21 receives a couple of first input signals V1+ and V1− and a couple of second input signals V2+ and V2−, and mixes the couple of first input signals V1+ and V1− with the couple of second input signals V2+ and V2− to output a couple of mixed signals I3+ and I3−, which are small signal currents in practice. The high impedance circuit 25 coupled to the mixing circuit 21 and the duplicating circuit 22 guides the couple of mixed signals I3+ and I3− to be input to the duplicating circuit 22. In addition, the duplicating circuit 22 has to be coupled to the mixing circuit 21, receives the couple of mixed signals I3+ and I3− and duplicates the couple of mixed signals I3+ and I3− to output a couple of duplicated signals I3'+ and I3'−.

In this embodiment, the couple of mixed signals I3+ and I3− pertains to small signal currents, so the couple of duplicated signals I3'+ and I3'− duplicated and outputted by the duplicating circuit 22 pertains to a couple of small signal currents. In addition, two current mirrors 223 of the duplicating circuit 22 respectively have the transistors Q7 and Q8, each of which may be a low impedance diode-connected transistor.

Furthermore, the loading circuit 23 coupled to the duplicating circuit 22 receives the couple of duplicated signals I3'+ and I3'−, and outputs a couple of output signals Vo+ and Vo− according to the couple of duplicated signals I3'+ and I3'−. The common mode feedback circuit 24 coupled to the loading circuit 23 stabilizes the couple of output signals Vo+ and Vo− outputted from the loading circuit 23. In addition, the couple of output signals Vo+ and Vo− is influenced by the couple of duplicated signals I3'+ and I3'− pertaining to a couple of small signals and the couple of output signals Vo+ and Vo− is a couple of output signals pertaining to a couple of small signals.

The structures and the functions of the mixing circuit 21, the duplicating circuit 22, the loading circuit 23 and the common mode feedback circuit 24 of this embodiment are the same as those of the mixing circuit 21, the duplicating circuit 22, the loading circuit 23 and the common mode feedback circuit 24 of the first embodiment of FIG. 2, so detailed descriptions thereof will be omitted.

In this embodiment, the high impedance circuit 25 includes two current sources IC1 and IC2 and is coupled to the differential output terminal 213 and the duplicating circuit 22 to guide the couple of mixed signals I3+ and I3− to be inputted to the duplicating circuit 22. The two current sources IC1 and IC2 of this embodiment may be high-impedance current sources in practice.

As shown in FIG. 4, the conversion mixer 4 of this embodiment operates as follows. First, the first differential input terminal 211 and the second differential input terminal 212 of the mixing circuit 21 respectively receive the couple of high-frequency first input signals V1+ and V1− and the couple of high-frequency second input signals V2+ and V2− from the outside, and the mixing circuit 21 mixes the couple of first input signals V1+ and V1− with the couple of second input signals V2+ and V2− to output the couple of low-frequency mixed signals I3+ and I3− to the high impedance circuit 25. Next, the two current sources IC1 and IC2 of the high impedance circuit 25 guide the couple of mixed signals I3+ and I3− to be inputted to the duplicating circuit 22, and the two current mirrors 223 of the duplicating circuit 22 duplicate the couple of mixed signals I3+ and I3'− to output the couple of duplicated signals I3'+ and I3'− to the loading circuit 23. Thus, the loading circuit 23 stabilizes and outputs the couple of output signals Vo+ and Vo− at first terminals of the first resistor R1 and the second resistor R2 of the loading circuit 23 in conjunction with the common mode feedback circuit 24 according to the couple of duplicated signals I3'+ and I3'−.

Because the conversion mixer 4 has the differential inputs, the couple of first input signals V1+ and V1− includes DC and AC components, and the couple of mixed signals I3+ and I3− mixed by the mixing circuit also includes the DC and AC components. Thus, when the couple of mixed signals I3+ and I3− is inputted to the duplicating circuit 22, the high impedance circuit 25 shunts the DC and AC components of the mixing circuit 21 and only the AC components of the mixing circuit 21 are inputted to the duplicating circuit 22 for duplication. In this manner, the fluctuation range of the couple of output signals Vo+ and Vo− is only influenced by the range of the couple of first input signals V1+ and V1−. So, it is possible to prevent the dead zone phenomenon from occurring, to make the couple of output signals Vo+ and Vo− linear and increase the operational range.

In summary, the conversion mixer of the invention utilizes the mixing circuit to mix the couple of first high-frequency input signals with the couple of second high-frequency input signals and then output the couple of low-frequency mixed signals. Also, the duplicating circuit duplicates the couple of mixed signals into the couple of duplicated signals, and then the loading circuit outputs the couple of output signals. Compared with the prior art, the duplicating circuit can separate the mixing circuit from the loading circuit so that the influence of the loading circuit on the couple of output signals is reduced, and the couple of output signals is changed with the influence of the couple of first input signals. Alternatively, using the high impedance circuit can shunt the DC and AC components of the couple of mixed signals so that the DC component of the large signal in the couple of mixed signals passes through the high impedance circuit, and only the AC component of the small signal in the couple of mixed signals is sent to the duplicating circuit. According to this manner, the couple of output signals is only influenced by the couple of first input signals, and the output signal is small, such that the couple of output signals is linear and has the above mentioned larger operation range while avoiding the dead zone phenomenon. In addition, the current value of the duplicated signal can be reduced by adjusting the ratio of the channel regions of the transistors in the current mirror of the duplicating circuit so that power consumption can be reduced.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A conversion mixer with high impedance circuit, comprising:
    a mixing circuit for receiving a couple of first input signals and a couple of second input signals and mixing the couple of first input signals with the couple of second input signals to output a couple of mixed signals;
    a duplicating circuit, which is coupled to the mixing circuit, for receiving the couple of mixed signals and duplicating the couple of mixed signals to output a couple of duplicated signals;
    a high impedance circuit, which is coupled to the mixing circuit and the duplicating circuit, for providing first and second currents, respectively, to the couple of mixed signals; and
    a loading circuit, which is coupled to the duplicating circuit, for receiving the couple of duplicated signals and outputting a couple of output signals according to the couple of duplicated signals.

2. The conversion mixer with high impedance circuit according to claim 1, wherein the duplicating circuit is coupled to a voltage source, which drives the mixing circuit and the loading circuit through the duplicating circuit.

3. The conversion mixer with high impedance circuit according to claim 1, wherein the mixing circuit comprises a first differential input terminal, a second differential input terminal and a differential output terminal, the first differential input terminal and the second differential input terminal respectively receive the couple of first input signals and the couple of second input signals, and the mixing circuit mixes the couple of first input signals with the couple of second input signals to output the couple of mixed signals from the differential output terminal.

4. The conversion mixer with high impedance circuit according to claim 3, wherein the duplicating circuit comprises:
    two current mirrors, each of which has a plurality of transistors, is coupled to the differential output terminal to receive the couple of mixed signals, and duplicates the couple of mixed signals to output the couple of duplicated signals,
    wherein the couple of mixed signals and the couple of duplicated signals have differential currents.

5. The conversion mixer with high impedance circuit according to claim 4, wherein the loading circuit comprises:
    a resistor, which has two terminals respectively coupled to the current mirrors, receives the couple of duplicated signals, and outputs the couple of output signals from the two terminals according to the couple of duplicated signals, wherein the couple of output signals is a voltage.

6. The conversion mixer with high impedance circuit according to claim 3, wherein the high impedance circuit comprises: two current sources, which are coupled to the differential output terminal and the duplicating circuit to guide the couple of mixed signals to be inputted to the duplicating circuit.

7. The conversion mixer with high impedance circuit according to claim 1, further comprising:
    a common mode feedback circuit, which is coupled to the loading circuit and stabilizes the couple of output signals outputted from the loading circuit.

8. The conversion mixer with high impedance circuit according to claim 1, wherein the conversion mixer is a direct down-sampling conversion mixer, each of the couple of first input signals and the couple of second input signals is a couple of high-frequency signals, the couple of mixed signals is a couple of low-frequency signals.

9. The conversion mixer with high impedance circuit according to claim 6, wherein the current sources are high impedance current sources.

10. The conversion mixer with high impedance circuit according to claim 4, wherein one of the transistors of the current mirrors is a diode-connected transistor.

11. The conversion mixer with high impedance circuit according to claim 1, wherein the couple of duplicated signals has a couple of small signal currents.

12. The conversion mixer with high impedance circuit according to claim 1, wherein the high impedance circuit shunts DC and AC components of the mixing circuit and only the AC components of the mixing circuit are inputted to the duplicating circuit for duplication.

* * * * *